United States Patent [19]

Hamilton

[11] Patent Number: 5,402,078
[45] Date of Patent: Mar. 28, 1995

[54] INTERCONNECTION SYSTEM FOR BURN-IN BOARDS

[75] Inventor: Harold E. Hamilton, Minneapolis, Minn.

[73] Assignee: Micro Control Company, Minneapolis, Minn.

[21] Appl. No.: 960,120

[22] Filed: Oct. 13, 1992

[51] Int. Cl.[6] .......................................... G01R 31/02
[52] U.S. Cl. .................................. 324/760; 324/755
[58] Field of Search ............... 324/158 F, 760, 755; 439/61, 62; 219/209

[56] References Cited

U.S. PATENT DOCUMENTS

| | | | |
|---|---|---|---|
| 2,951,184 | 8/1960 | Wyma | 439/61 |
| 3,564,343 | 2/1971 | Guest et al. | 439/61 |
| 3,794,954 | 2/1974 | Reimer | 339/19 |
| 4,145,620 | 3/1979 | Dice | 324/501 |
| 4,468,616 | 8/1984 | Yoshizaki | 324/158 |
| 4,582,374 | 4/1986 | Conrad et al. | 439/61 |
| 4,647,123 | 3/1987 | Chin et al. | 339/17 LM |
| 4,730,232 | 3/1988 | Lindberg | 361/381 |
| 4,799,021 | 1/1989 | Cozzi | 324/73 R |
| 4,838,798 | 6/1989 | Evans et al. | 439/61 |
| 4,900,948 | 2/1990 | Hamilton | 307/149 |
| 4,922,191 | 5/1990 | Conover | 324/158 F |
| 5,003,156 | 3/1991 | Kilpatrick et al. | 219/209 |
| 5,093,985 | 3/1992 | Houldsworth et al. | 439/61 |
| 5,103,168 | 4/1992 | Fuoco | 324/158 F |
| 5,123,850 | 6/1992 | Elder et al. | 439/67 |

*Primary Examiner*—Ernest F. Karlsen
*Attorney, Agent, or Firm*—Westman, Champlin & Kelly

[57] ABSTRACT

An interconnection system for electrically connecting a burn-in board with one or more driver/receiver boards in a burn-in system. The interconnection system comprises a burn-in board located in an environmental test chamber, a first driver/receiver board having a first edge connector at a first end and a second driver/receiver board having a second edge connector at a first end. The first and second edge connectors are double density edge connectors having a slot into which the burn-in board can be inserted. A plurality of control components are mounted on the first driver/receiver board and the second driver/receiver board to provide test signals or stimuli for exercising electronic circuit components on the burn-in board. The burn-in board has a plurality of sockets thereon for insertion of the electronic circuit components.

17 Claims, 3 Drawing Sheets

INTERCONNECTION SYSTEM FOR BURN-IN BOARDS

BACKGROUND OF THE INVENTION

The present invention relates to the testing of electronic circuit components in an environmental test chamber and, in particular, to an interconnection system for electrically connecting the electronic circuit components mounted on a burn-in board to control components mounted on driver/receiver boards in a burn-in system.

As electronic circuit components become more complex, an increasingly large number of electrical connections are required between each burn-in board and corresponding driver/receiver board in a burn-in system. One way in which these connection requirements have been met is through the use of a second driver/receiver board placed alongside the first driver/receiver board and electrically connected to an auxiliary board. The auxiliary board extends through a slot in an outer wall of the environmental test chamber parallel to the burn-in board, which extends through an adjacent slot, and is electrically connected to the burn-in board inside the environmental test chamber.

Although this configuration provides a large number of electrical connections between the burn-in board and driver/receiver boards, a large number of slots in the outer wall of the environmental chamber are required. This requires more space in the environmental chamber. In addition, the leads making the connections between the second driver/receiver board and the burn-in board are relatively lengthy and a more complex and costly burn-in board is required.

Another solution to the problem of increased connection requirements is to increase the width of the burn-in board and driver/receiver board and to use a long edge connector to electrically connect the burn-in board with the driver/receiver board. A problem with this solution is that it requires the use of a large, expensive driver/receiver board.

SUMMARY OF THE INVENTION

The present invention relates to an interconnection system for electrically connecting a burn-in board with one or more driver/receiver boards in a burn-in system. The interconnection system permits the transmission of test signals and stimuli from control components mounted on the driver/receiver boards to electronic circuit components mounted on the burn-in board.

The interconnection system comprises a burn-in board, a first driver/receiver board having a first edge connector at a first end and a second driver/receiver board having a second edge connector at a first end. The burn-in board is located in an environmental chamber of a burn-in system and has a first end which extends through a slot in an outer wall of the environmental chamber. The first and second driver/receiver boards are located outside of the environmental chamber.

The first driver/receiver board and the second driver/receiver board are aligned in the same plane and the first edge connector and the second edge connector are attached thereto so that a slot in each edge connector faces the outer wall of the environmental chamber. A portion of the first end of the burn-in board is inserted into the slot in the first edge connector and an adjacent second portion of the first end of the burn-in board is inserted into the slot in the second edge connector.

The alignment of the first and second driver/receiver boards permits them to be connected to the same burn-in board while using only one slot in the outer wall of the environmental chamber. This increases the amount of space available for driver electronics in the system and permits a greater number of burn-in boards to be mounted in the environmental chamber. Both the burn-in boards and the driver/receiver boards can be oriented vertically or horizontally and can be mounted in racks.

DETAILED DESCRIPTION OF THE PREFERRED EMBODIMENTS

Figure 1:
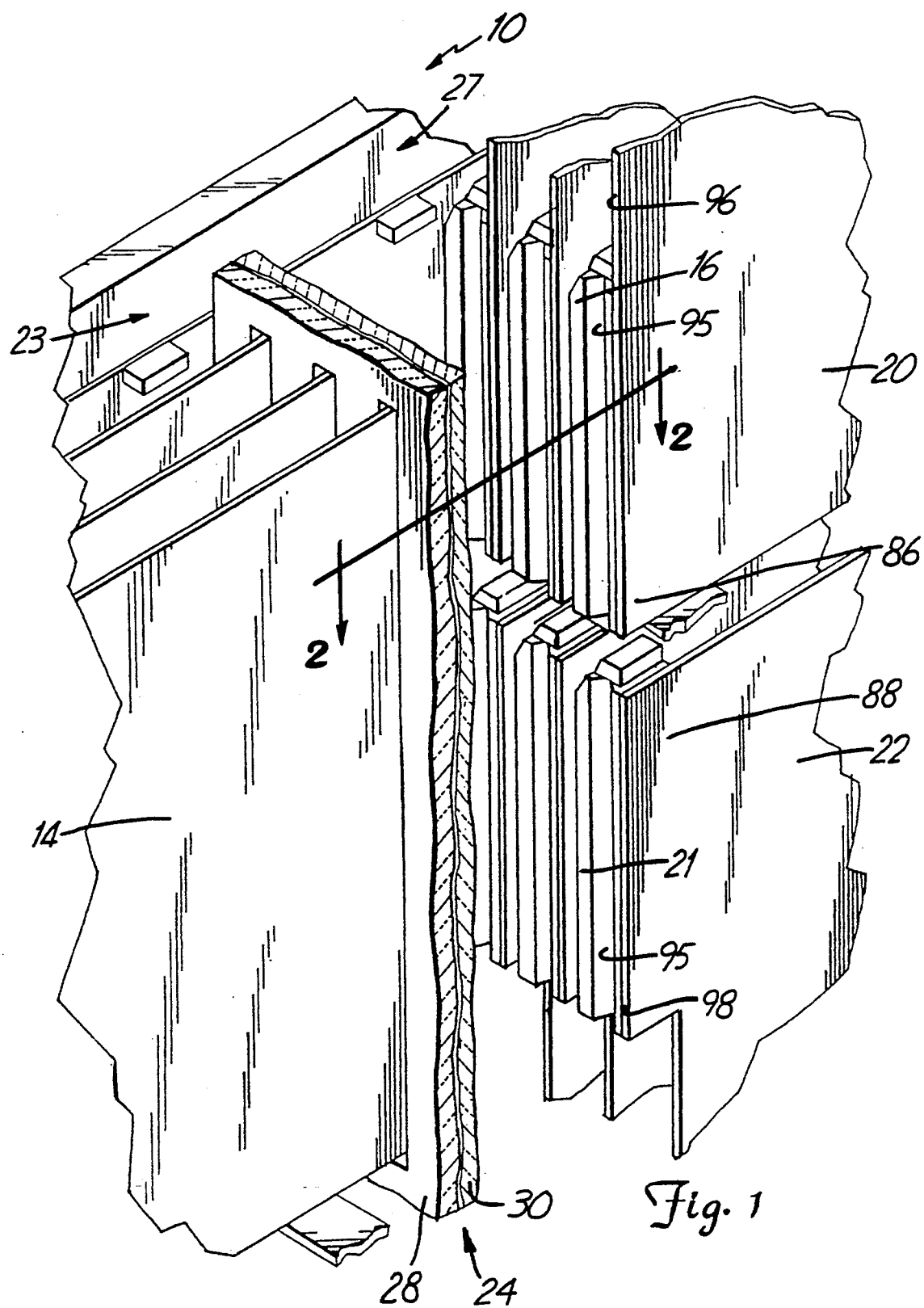
FIG. 1 is a perspective view of the interconnection system of the present invention mounted in a typical burn-in system.
Figure 2:
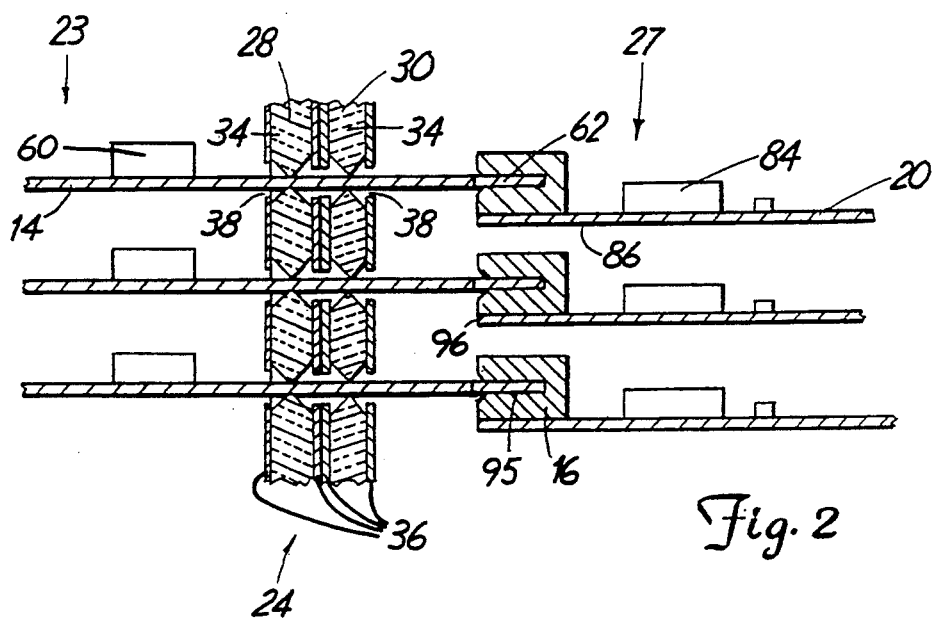
FIG. 2 is a sectional view of the interconnection system of the present invention taken generally along line 2—2 in FIG. 1 with the burn-in boards inserted in the edge connectors.

A portion of a burn-in system utilizing the interconnection system 10 of the present invention is shown in FIG. 1. The interconnection system 10, shown also in FIG. 2, comprises a burn-in or circuit board 14, a first edge connector 16 attached to a first driver/receiver or control board 20 and a second edge connector 21 attached to a second driver/receiver or control board 22. The burn-in board 14 is located in an environmental chamber 23 and can be inserted into the first edge connector 16 and the second edge connector 21.

An outer wall 24 of the environmental chamber 23 separates the chamber 23 from a driver/receiver board card cage 27 containing the first and second driver/receiver boards 20,22. The outer wall 24 comprises a first sheet 28 and a second sheet, each of which comprises an inner layer 34 fabricated from a flexible sealing material such as silicone rubber positioned between two rigid outer layers 36. A plurality of parallel slots 38 are formed in both the first sheet 28 and the second sheet 30 so that a relatively flat printed circuit board such as the burn-in board 14 can be inserted through the outer wall 24. The slots 38 remain substantially closed when no board is inserted therethrough.

Figure 3:
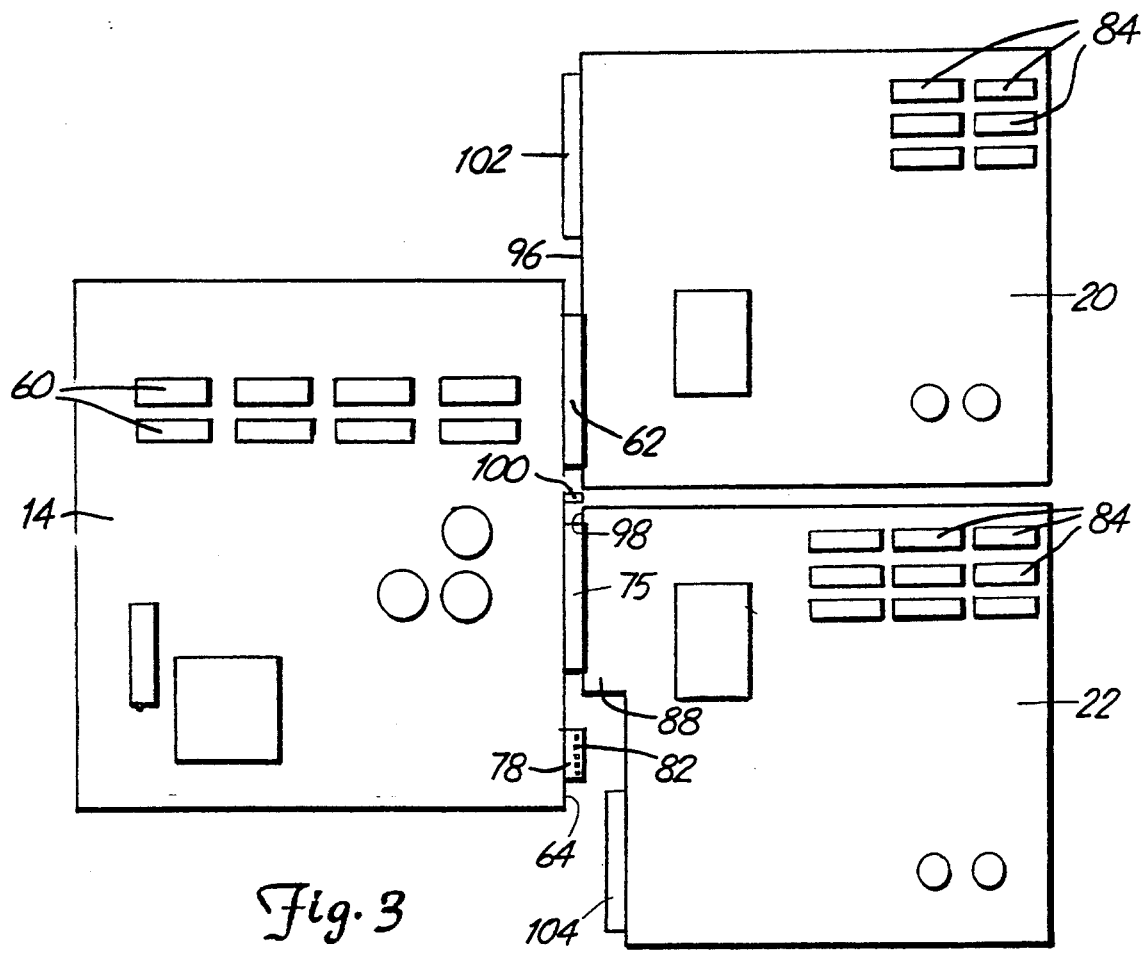
FIG. 3 is a schematic side view of the interconnection system of the present invention.
Figure 4:
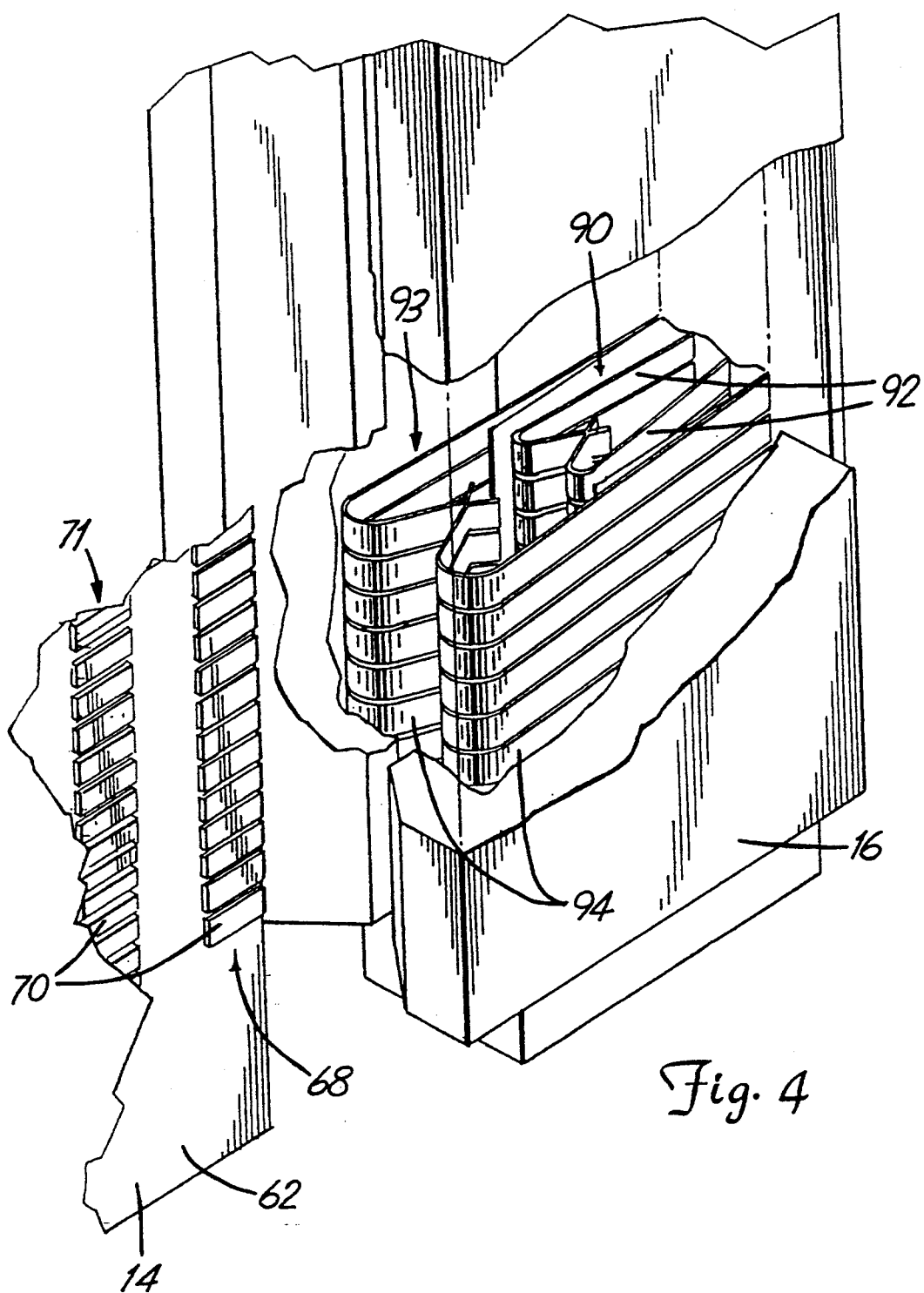
FIG. 4 is an exploded perspective view of a portion of the interconnection system of the present invention.

The burn-in board 14, shown in FIGS. 3 and 4, comprises a printed circuit board having a plurality of sockets 60 mounted on a first side capable of receiving both analog and digital electronic circuit components. A first tongue 62 extends from a first edge 64 of the burn-in board 14 and has an outer row 68 of contact pads 70 and a parallel inner row of 71 contact pads 70 located on both a first side and a second side. A second tongue 75 extends from the first edge 64 of the burn-in board 14 spaced from the first tongue 62 and has an outer row 68 of contact pads 70 and a parallel inner row 71 of contact pads 70 located on both a first side and a second side. The contact pads 70 are electrically connected to selected pins of the sockets 60 on the burn-in board 14. A smaller third tongue 78 extends from the first edge 64 of the burn-in board 14 and has a plurality of contacts 82 which are electrically connected to one or more power supplies by inserting the tongue 78 into a power connector.

Both the first driver/receiver board 20 and the second driver/receiver board 22 comprise printed circuit boards having a plurality of control components 84 mounted thereon. The first edge connector 16 is attached at a first end 86 of the first driver/receiver board 20 and the second edge connector 21 is attached at a first end 88 of the second driver/receiver board 22. Both the first edge connector 16 and the second edge connector 21 are double density edge connectors having two facing inner rows 90 of contact pins 92 and two facing outer rows 93 of contact pins 94. The two sets of pin rows form a slot 95 into which the first tongue 62 or the second tongue 75 of the burn-in board can be inserted. The contact pins 92 and 94 are electrically connected to selected control components 84 on the first and second driver/receiver boards 20,22.

The first driver/receiver board 20 is placed in the driver/receiver board card cage 27 so that a first edge 96 faces the outer wall 24 of the environmental chamber 23 and the slot 95 of the first edge connector 16 is aligned with one of the slots 38. The second driver/receiver board 22 is placed in the driver/receiver board card cage 27 so that a first edge 98 faces the outer wall 24 and the slot 95 of the second edge connector 21 is aligned with the same slot 38 as the slot 95 of the first edge connector 16. The first driver/receiver board 20 and the second driver/receiver board 22 are thus placed in the driver/receiver board card cage 27 such that they are "stacked" edge to edge and are aligned in the same plane.

The burn-in board 14 is placed in the environmental chamber 23 so that the first edge 64 of the burn-in board 14 extends through the slots 38 in the outer wall 24 of the environmental chamber 23. When the burn-in board 14 is inserted through the slots 38, the sealing layer 34 in both the first sheet 28 and the second sheet 30 will press against both sides of the burn-in board 14. The sealing layers 34 thus will substantially preserve the seal in each slot 38 of the outer wall 24 to preserve the temperature and humidity in the environmental chamber 23.

The burn-in board 14 is positioned so that an alignment pin 100 is positioned between the first and second driver/receiver boards 20,22 and the first edge 64 is aligned with the slots 95 of the first edge connector 16 and the second edge connector 21. The first tongue 62 is inserted into the slot 95 of the first edge connector 16 and the second tongue 75 is inserted into the slot 95 of the second edge connector 21 so that the outer rows 68 of contact pads 70 come into contact with the inner rows 90 of contact pins 92 and the inner rows 71 of contact pads 70 come into contact with the outer rows 93 of contact pins 94. Each of the contact pins 92 and 94 is aligned with and resiliently engages a corresponding contact pad 70. The control components 84 on the first and second driver/receiver boards 20,22 are thus electrically connected to the electronic circuit components in the sockets 60 on the burn-in board 14. The first driver/receiver board 20 has a first extension 102 from its first edge 96 and the second driver/receiver board 22 has a second extension 104 from its first edge 98. The first and second extensions 102, 104 are used to interconnect the first driver/receiver board 20 and the second driver/receiver board 22 with other driver/receiver boards.

The control components 84 provide standard signals or stimuli to the electronic circuit components on the burn-in board 14 causing their operating, and can receive return signals from the electronic circuit components. The signals can be preprogrammed or can be sent from a programmable computer electrically connected to the control components 84. This exercising of the electronic circuit components occurs while the temperature and humidity of the environmental chamber 23 is set by environmental controls.

The alignment or "stacking" of the first and second driver/receiver boards 20,22 in the same plane allows a large number of control components 84 to be electrically connected to the electronic circuit components on the burn-in board 14 while requiring only one slot 38 through the outer wall 24 of the environmental chamber 23. The use of only one slot 38 in the outer wall 24 for each burn-in board 14 allows a greater number of burn-in boards 14 to be placed in the environmental chamber 23. The use of two separate driver/receiver boards 20,22 thus provides a sufficient number of electrical connections to drive the electronic circuit components in the sockets 60 without the use of an extremely large burn-in board 14 or large driver/receiver boards. The first and second driver/receiver boards 20,22 are located outside of the environmental chamber, so the additional vertical height caused by their "stacking" does not require a larger environmental, chamber.

The driver/receiver boards 20,22 can be mounted in a rack in the driver/receiver board card cage 27 and the burn-in boards 14 can be mounted in a second rack in the environmental chamber 23. The racks, which can be of standard construction, hold the burn-in boards 14 and the driver/receiver boards 20,22 parallel to and spaced from each other. Both the burn-in boards 14 and the driver/receiver boards 20,22 can be placed in the racks so that they are aligned in the vertical or the horizontal planes.

The first and second sheets 28,30 can be spaced from each other and a plurality of spacers can be inserted between them to help insure a uniform spacing. Also, although the outer wall 24 was described as comprising a first sheet 28 and a second sheet 30, the outer wall 24 can comprise any number of sheets having a variety of constructions in addition to the layered construction described.

The first and second edge connectors 16,21 were described as being directly attached to the first and second driver/receiver boards 20,22. However, the first and second edge connectors 16,21 can be attached to adaptor boards which are then attached to the first and second driver/receiver boards 20,22.

Although the present invention has been described with reference to preferred embodiments, workers skilled in the art will recognize that changes may be made in form and detail without departing from the spirit and scope of the invention.

What is claimed is:

1. An apparatus for providing test signals and stimuli to a plurality of electronic circuit components in an environmental test chamber from a plurality of control components outside of the environmental test chamber, the apparatus comprising:
   a circuit board mounted in an environmental test chamber having electronic circuit components mounted thereon;
   a first control board having control components mounted thereon;

a second control board aligned in the same plane as the first control board and having control components mounted thereon;

first connection means for electrically connecting the control components on the first control board to selected electronic circuit components on the circuit board; and second connection means for electrically connecting the control components on the second control board to selected electronic circuit components on the circuit board, the control boards being outside the environmental chamber and substantially coplanar with each other and the circuit board.

2. The apparatus of claim 1 wherein the first connection means comprises an edge connector attached at a first end of the first control board.

3. The apparatus of claim 2 and slot means in the edge connector for receiving a first tongue extending from a first edge of the circuit board.

4. The apparatus of claim 3 wherein the second connection means comprises a second edge connector attached at a first end of the second control board.

5. The apparatus of claim 4 and second slot means in the second edge connector for receiving a second tongue extending from the first edge of the circuit board.

6. The apparatus of claim 1 wherein the portion of the circuit board on which the electronic circuit components are mounted is located within the environmental test chamber.

7. The apparatus of claim 6 wherein a first end of the circuit board extends through one of a plurality of parallel slots in an outer wall of the environmental test chamber.

8. The apparatus of claim 7 wherein the outer wall of the environmental test chamber comprises a first sheet and a second sheet.

9. The apparatus of claim 3 wherein the first edge connector contains a plurality of contact pins which resiliently engage a plurality of contact pads located on the first tongue.

10. The apparatus of claim 9 wherein the first edge connector is a high density edge connector having two facing inner rows of contact pins and two facing outer rows of contact pins.

11. The apparatus of claim 5 wherein the second edge connector contains a plurality of contact pins which resiliently engage a plurality of contact pads located on the second tongue.

12. The apparatus of claim 11 wherein the second edge connector is a high density edge connector having two facing inner rows of contact pins and two facing outer rows of contact pins.

13. The apparatus of claim 7 wherein the circuit board is mounted in a first rack and the first and second control boards are mounted in a second rack.

14. The apparatus of claim 13 and additional first and second control boards mounted in the second rack.

15. The apparatus of claim 14 and additional circuit boards mounted in the first rack.

16. The apparatus of claim 15 and additional first and second connection means for electrically connecting the control components on the additional first and second control boards to selected electronic circuit components on the additional circuit boards.

17. An apparatus for providing test signals and stimuli to a plurality of electronic circuit components in an environmental test chamber from a plurality of control components, the apparatus comprising:

a circuit board adapted for mounting in an environmental test chamber having electronic circuit components to test operated mounted thereon;

a first control board connected to the circuit board, and having control components for controlling signals to selected components on the circuit board mounted thereon; and a second control board connected to the circuit board and having control components for controlling signals to selected components on the circuit board mounted thereon, the second control board having a first edge facing a first edge of the first control board and the second control board being aligned in the same plane as the first control board and in the same plane as the circuit board, the first and second control boards being adapted for mounting outside of the environmental test chamber.

* * * * *